US005534824A

United States Patent [19]

Nalos et al.

[11] Patent Number: 5,534,824

[45] Date of Patent: Jul. 9, 1996

[54] PULSED-CURRENT ELECTRON BEAM METHOD AND APPARATUS FOR USE IN GENERATING AND AMPLIFYING ELECTROMAGNETIC ENERGY

[75] Inventors: Ervin J. Nalos, Bellevue; James C. Axtell, Des Moines, both of Wash.

[73] Assignee: The Boeing Company

[21] Appl. No.: 326,113

[22] Filed: Oct. 19, 1994

Related U.S. Application Data

[63] Continuation-in-part of Ser. No. 37,348, Mar. 26, 1993, abandoned.

[51] Int. Cl.[6] .............................. H01J 25/04; H03B 9/02

[52] U.S. Cl. .............................. 331/81; 315/5; 315/5.37; 327/301

[58] Field of Search .......................... 331/79, 81; 315/4, 315/5, 5.37, 5.33; 327/301, 506

[56] References Cited

U.S. PATENT DOCUMENTS

| | | | |
|---|---|---|---|
| 2,394,055 | 2/1946 | Hansen | 250/36 |
| 2,439,387 | 4/1948 | Hansen et al. | 331/79 |
| 2,476,765 | 7/1949 | Pierce | 332/25 |
| 2,508,645 | 5/1950 | Linder | 250/36 |
| 3,248,595 | 4/1966 | Dehn | 315/5.16 |
| 4,481,485 | 11/1984 | Carruthers et al. | 331/66 |
| 4,617,532 | 10/1986 | Chen et al. | 331/107 |
| 4,745,336 | 5/1988 | Ohkawa | 331/79 |
| 4,751,429 | 6/1988 | Minich | 315/5 |
| 4,900,947 | 2/1990 | Weiner et al. | 307/110 |
| 4,999,537 | 3/1991 | Weisbuch et al. | 313/311 |

OTHER PUBLICATIONS

Ketchen et al., "Generation of Subpicosecond Electrical Pulses on Coplanar Transmission Lines," *Applied Physics Letter*, 48 (12), Mar. 24, 1986, pp. 751–753.

Tallerico et al., "An RF–Driven Lasertron," paper for 1988 Linear Accelerator Conference, Oct. 3–7, 1988, Los Alamos National Laboratory, 12 pp.

*Primary Examiner*—Andrew M. Dolinar

*Attorney, Agent, or Firm*—Christensen, O'Connor, Johnson & Kindness

[57] ABSTRACT

Disclosed is a method and apparatus for generating a very fast electron pulse (30) in a vacuum. The electron source comprises a pulse-forming line (12), a solid-state switch (14), a cold field-emitting cathode (16), and an anode grid (18). The anode grid forms a portion of a side of an evacuated circuit (20) that may be used to produce an oscillating output signal or that may be a portion of a waveguide carrying an rf signal to be amplified. In operation, the pulse-forming line is charged to a desirable voltage. The solid-state switch is then closed, coupling the pulse-forming line to the cathode. An electric field develops between the cathode and anode grid. Under the influence of the electric field, the cathode emits an electron current pulse that is attracted by the anode grid. The current pulse enters the region between the anode and closure grids, and interacts with the electromagnetic field in the cavity at the appropriate time to add its energy to the electromagnetic field of the cavity. A group of electron sources can be employed to provide rf generation or wideband amplification in a waveguide circuit through proper timing of the closure of a set of cathode-switch elements configured along the direction of propagation of a wave to be amplified. By proper selection of timing, a very flexible set of output frequencies and waveforms may be obtained. The propagating waveguide circuit may also be made resonant by shorting both ends, and configured for pulse-to-pulse frequency diversity by properly timing the cathode-switch current sources to generate alternative frequencies. The multiple-source resonant circuit can also be used to generate very high peak power pulses by using the set of cathode-switch sources repetitively to build up a high voltage across the cavity, with the output load disconnected, and then to discharge the built-up voltage into the load by closing a switch in the output circuit at the appropriate time.

18 Claims, 13 Drawing Sheets

| MODES OF OPERATION FOR DEVICE WITH N = 80 CATHODES SPACED 1.5CM APART, EACH 1X4CM | RELATIVE PEAK POWER | CATHODE AREA TRIGGERED $CM^2$ | BURST DURATION NSEC | NUMBER OF CYCLES |
|---|---|---|---|---|
| 1. SHORT PULSE RADAR | | | | |
| 1 $GH_Z$ OPTION 1 | PK | 4 | 79 | 79 |
| 1 $GH_Z$ OPTION 2 | 2 PK | 8 | 40 | 40 |
| 1 $GH_Z$ OPTION 3 | 4 PK | 16 | 20 | 20 |
| "3" $GH_Z$ (2.94) | PK | 4 | 80 | 80 |
| 5 $GH_Z$ | PK | 4 | 76 | 76 |
| 2. SHORT PULSE RADAR WITH "SPIKE" PRECURSOR | | | | |
| 1 $GH_Z$ OPTION 1 | PK | 4 | 80 | 80 |
| 1 $GH_Z$ OPTION 2 | 2 PK | 8 | 38 | 38 |
| 1 $GH_Z$ OPTION 3 | 4 PK | 16 | 18 | 18 |
| "3" $GH_Z$ (2.94) | PK | 4 | 23.1 | 77 |
| 5 $GH_Z$ | PK | 4 | 15.6 | 78 |
| 3. DUAL FREQUENCY RADAR WITH SELECTABLE $\Delta f$ ($MH_Z$) | | | | |
| 1 $GH_Z$ $\Delta f$ = 65 | PK | 4 | 80 | 80 |
| 3 $GH_Z$ $\Delta f$ = 670 | PK | 4 | 26 | 80 |
| 5 $GH_Z$ NA. | | | | |

*Fig. 10C.*

PULSED-CURRENT ELECTRON BEAM METHOD AND APPARATUS FOR USE IN GENERATING AND AMPLIFYING ELECTROMAGNETIC ENERGY

RELATED APPLICATIONS

The present application is a continuation-in-part of our previous application Ser. No. 08/037,348 filed Mar. 26, 1993, now abandoned the benefit of the filing date being claimed under 35 U.S.C. §120.

FIELD OF THE INVENTION

The present invention relates generally to radio frequency (rf) signal generation and amplification and, more particularly, to a method and apparatus for generating and amplifying high frequency signals using a pulsed-current electron beam.

BACKGROUND OF THE INVENTION

High power rf generation has typically required the serial combination of a master oscillator and power amplifier (MOPA), since; oscillators in general are not very efficient and are difficult to modulate at high power levels. In the microwave region, MOPA generation techniques involve conventional oscillators and amplifiers having electron guns that either operate in a continuous-wave (CW) regime or in pulses that are typically microseconds long. These are often called common beam modulation oscillators. The CW long-pulse electron beam employed by a common beam oscillator is accelerated by high voltage and then modulated at the oscillation frequency in a region of an electromagnetic field, e.g., within a resonator, that varies sinusoidally with time. MOPA rf generation is disadvantageous because the devices are generally complex and cumbersome.

An alternative to MOPA generation is embodied in a self-contained velocity modulation feedback oscillator such as the Klystron. The typical Klystron oscillator includes a thermionic cathode that produces a continuous flux of electrons from the cathode surface. The continuous beam of electrons from the cathode enters a cavity resonator called the input cavity in which the beam energy is modulated by the cavity's electromagnetic field. The modulated beam enters a field-free region and is allowed to "drift" until the slow electrons at the front of the beam are met by the fast electrons from the rear of the beam to form a "bunch" of electrons. At the proper location in space and time, the bunch of electrons enters a second electromagnetic field present in an output cavity in such a way as to give up energy to the electromagnetic field. Some of the energy from the output cavity electromagnetic field is fed back to the electromagnetic field in the input cavity in proper phase relationship to sustain oscillations.

The simple Klystron embodiment is relatively inefficient, in part, because many of the electrons initially emitted by the cathode are ineffectively modulated, and arrive either too soon or too late to give up energy to the electromagnetic field in the output cavity. These electrons are either simply lost or, in the worst case, extract energy from the electromagnetic field rather than adding energy to it. There are also limitations on the electron current that can be emitted from a thermionic cathode, with cathode life limited by electron depletion. The maximum temperature is limited by irreversible damage to the cathode. These temperature constraints necessitate relatively high accelerating voltages which, in turn, require the device to have x-ray shielding when producing a sustained power level.

Another device that has more recently been used to generate rf energy from an electron beam is the Lasertron. In the Lasertron, the thermionic cathode and the input cavity resonator of the Klystron are replaced by a photoelectric cathode that is activated ("gated") by a laser pulse to excite a pulsed beam of electrons from the cathode. The pulsed beam passes through a cavity resonator at the appropriate time and space relationship to add energy to the electromagnetic field present in the cavity resonator. By proper shaping of the gated pulse, the Lasertron achieves higher efficiency than the Klystron. A disadvantage of the Lasertron is that the laser-activated photoelectric cathodes used have a short lifetime. The Lasertron also suffers from the disadvantage that the number of electrons in the pulsed electron beam are directly related to the energy in the laser pulse, so that high rf power output demands powerful lasers, which are expensive and have a relatively short lifetime.

SUMMARY OF THE INVENTION

The disclosed invention is a method and apparatus for generating a plurality of electrons in the form of an electron current pulse in a vacuum. Once formed, the electron current pulse passes into an electromagnetic field region, where it interacts with the electromagnetic field in such a way as to add energy to the field.

In one aspect of the invention, an apparatus in accordance with the invention comprises: (a) an anode grid; (b) a cold emission cathode which is positioned in close proximity to the anode grid; (c) first and second conductors across which a voltage difference can be established; and (d) a switch, coupled between the cathode and the second conductor. The first conductor is coupled to the anode grid. The cathode emits electrons in response to a voltage difference between the cathode and anode grid. The switch is responsive to an activation signal wherein triggering the activation signal causes the switch to electrically connect the second conductor to the cathode, causing an electrical field to develop between the cathode and anode grid, such that an electron current pulse is emitted from the cathode. Embodiments of the switch can typically be activated to an accuracy of tens of picoseconds, resulting in the formation of "sharp" (well modulated) electron beams.

In accordance with other aspects of the invention, the apparatus includes a closure grid which is positioned opposite the anode grid, the anode and closure grids defining an interaction region between the anode and closure grids. The apparatus may also include an electron collector, positioned adjacent the closure grid but outside the activation region, for collecting the electrons in the electron current pulse after they traverse the interaction region.

In accordance with other aspects of the invention, the maximum delay or "jitter" between the triggering of the activation signal and closing of the switch is on the order of twenty picoseconds. Further, the duration of the electron pulse is dependent upon the quantity of charge stored in the storage component. The switch, once activated, will remain connected to the storage component until the charge is substantially depleted from the storage component.

In accordance with still further aspects of the invention, the apparatus provides an oscillating rf output through the inclusion of a resonating cavity. The resonating cavity provides a means of interaction of an electromagnetic field as it traverses the cavity gap, extracting energy in the process. The electron current pulse can also interact with a non-resonant circuit, either as an oscillator or amplifier, as described below.

BRIEF DESCRIPTION OF THE DRAWINGS

The foregoing aspects and many of the attendant advantages of this invention are more fully described in conjunction with the accompanying drawings, wherein:

FIGS. 10A–10C illustrate pictorial representations of a third exemplary rf source in accordance with the invention, and further include various modes of operating the rf source;

DETAILED DESCRIPTION OF THE PREFERRED EMBODIMENTS

Figure 1:
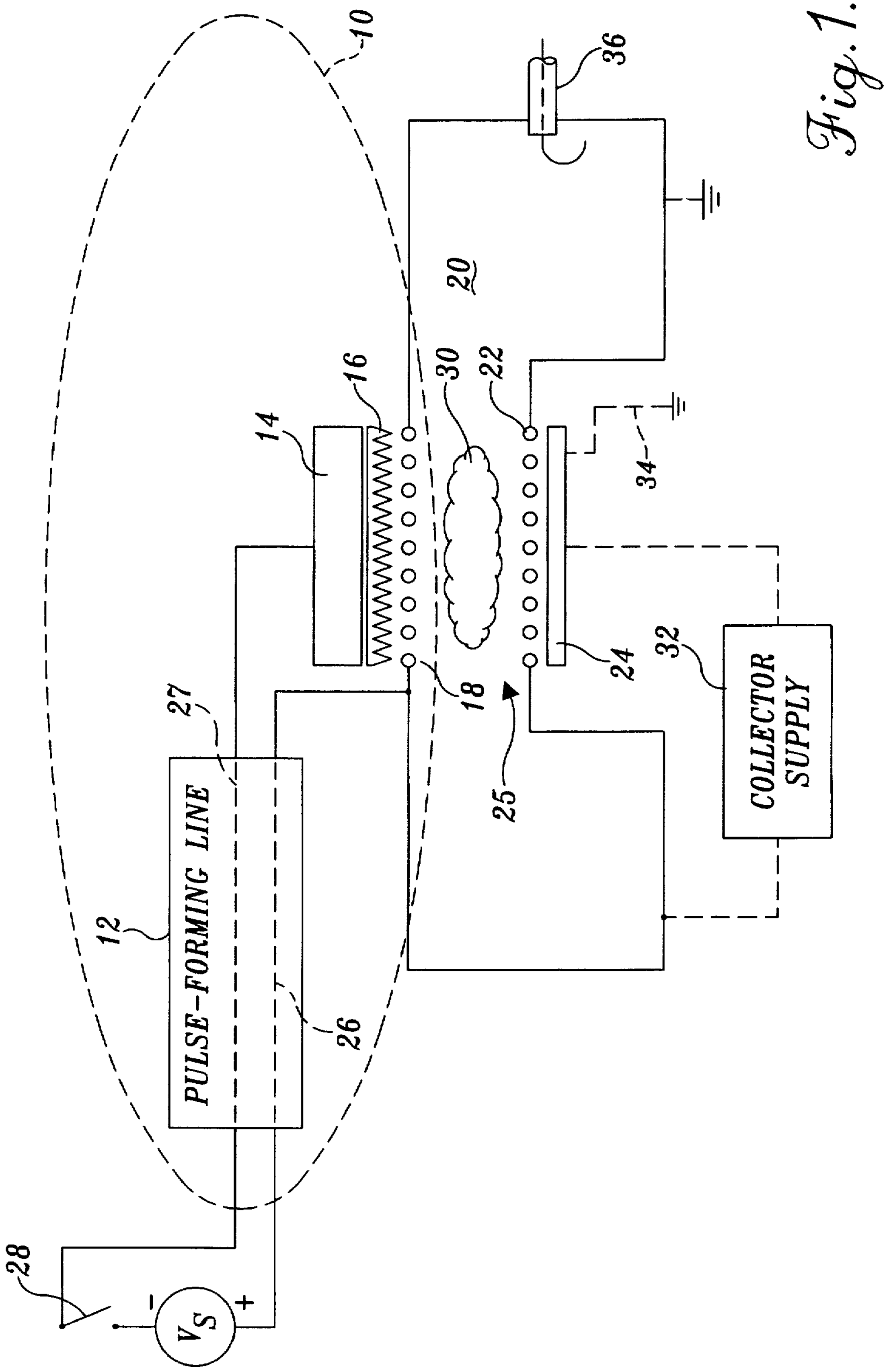
FIG. 1 is a schematic diagram illustrating an electron source in accordance with the invention.

The invention provides a method and apparatus for generating a pulsed-current or "gated" electron beam from direct current. In the preferred embodiments described herein, the generated pulsed electron beam is used as an oscillator to produce an rf output signal, or as an amplifier to amplify an existing rf signal present within an appropriate rf circuit such as a waveguide. In the following description, the pulsed-current or gated electron beam will alternatively be referred to as a pulsed electron beam or an electron current pulse. As depicted schematically in FIG. 1, an electron source 10 in accordance with the invention comprises a pulse-forming line 12, a solid-state switch 14, a cold field-emitting cathode 16, and a non-intercepting anode grid 18. The cold field-emitting cathode 16 and the anode grid 18 are enclosed in a vacuum.

The cathode 16 is described as a "cold field-emitting" cathode to distinguish it from thermionic cathodes that emit electrons upon reaching a threshold temperature. The cathode 16 does not require heat, but rather emits electrons in response to an electric field. The operation and fabrication of cold field-emitting cathodes are known to those skilled in the art. The cathode 16 is positioned between the solid-state switch 14 and the anode grid 18. The anode grid 18 forms a side, or a portion of a side, of an evacuated cavity 20. The cavity 20 is, for example, a resonating cavity for producing an oscillating output signal or, alternatively, a portion of a waveguide carrying an rf signal to be amplified by the electron source 10, either of which represents one of many possible interaction configurations for extracting energy from the pulsed electron beam. A closure grid 22, similar in structure to the anode grid 18, forms a side or a portion of a side of the cavity 20 that is opposite the anode grid.

An electron collector 24 is positioned in close proximity to the closure grid 22 to collect electrons emitted from the cathode 16, after they have traversed the evacuated region between the anode and closure grids 18 and 22. The evacuated region between the anode and closure grids is generally referred to as the interaction region 25 of the electron source. This region is where the pulsed electron beam that originates from electron source 10 interacts with an electromagnetic field present in the cavity 20.

The pulse-forming line 12 is a capacitive storage transmission line that includes first and second conductors 26 and 27 separated by a dielectric. The first conductor 26 couples the positive terminal of a power supply $V_s$ to the anode grid 18. The second conductor 27 has one end coupled to a charging switch 28 which, in turn, is coupled to the negative terminal of the power supply $V_s$.

Upon closure of the charging switch 28, the charging switch 28 establishes a circuit connection between the power supply and pulse-forming line to charge the line to a desired voltage level, the desired voltage level being established by the geometry of the cathode 16 and the distance between the cathode and anode grid 18. The characteristics of the pulse-forming line, e.g., the length, size, and material comprising the conductors, are predetermined such that the pulse-forming line stores the desired charge. The opposite end of the conductor 27 is coupled to the solid-state switch 14. The solid-state switch 14 is normally open, and isolates the pulse-forming line 12 from the cathode 16 when an electron current pulse is not being produced by cathode 16.

In the operation of the electron source 10, the charging switch 28 is closed for a period of time sufficient to charge the pulse-forming line 12 to a suitable voltage, e.g., from three to ten kilovolts or more. Thereafter, the charging switch 28 is opened, disconnecting the power supply $V_s$. The solid-state switch 14 is then quickly closed, e.g., in a fraction of a second, coupling the pulse-forming line 12 to the cathode 16. The cathode 16 rapidly drops to the voltage of the second conductor 27, causing an electric field to develop between the cathode 16 and anode grid 18. Under the influence of the electric field, the cathode 16 emits a plurality of electrons in the form of a pulsed electron beam 30. The pulsed electron beam 30, resembling a "puff" of electrons, is attracted by the anode grid 18, since the anode grid is positively charged with respect to the cathode.

The pulsed electron beam 30 enters the interaction region 25 between the anode and closure grids 18 and 22, and interacts with the electromagnetic field in the cavity 20. If the timing of the pulsed electron beam 30 is appropriate, it will add its energy to the electromagnetic field of the cavity, there,by increasing the energy content of the cavity. Eventually, the electrons comprising the pulsed electron beam 30 will impinge on the collector 24 and return to the power supply $V_s$.

The duration of the pulsed electron beam 30 is dependent, in large part, upon the electrical length or storage capacity of the pulse-forming line 12. Upon closure, the switch 14 will remain closed until the voltage across its terminals, and hence across the pulse-forming line 12, is at or near zero volts. Upon reaching approximately zero volts, current will no longer flow through the solid-state switch 14 and it will open. Upon opening of the solid-state switch 14, subsequent electron current pulses are generated by repeating the steps of: (1) closing charging switch 28; (2) waiting a sufficient period of time to allow charging of the pulse-forming line 12; (3) opening the charging switch 28; and (4) closing solid-state switch 14. It is noted that the charging switch 28 may be replaced with a high-impedance line in serial connection with the power source and the pulse-forming line 12. In this embodiment, it will be appreciated that the high-impedance line must be of sufficiently high impedance to ensure that the solid-state switch 14 will open after the pulse-forming line 12 has discharged. However, such a configuration may increase the charging time of the pulse-forming line, and thus would not be as advantageous as using charging switch 28.

With proper timing, the pulsed electron beam 30 will decelerate as it traverses the interaction region of cavity 20, giving up energy to the electromagnetic field in cavity 20. However, the electrons comprising the electron beam will not decelerate to zero velocity before impinging on the collector 24. This retained velocity constitutes kinetic energy that is given up to collector 24 in the form of heat. To reduce the heating effect on collector 24, a "depressed collector" or collector supply 32 may be coupled between the collector 24 and the cavity 20. The collector supply 32 establishes a voltage potential between the collector 24 and ground that further slows the electrons before they hit the collector. It is noted that, through the use of the collector supply 32, a portion of the energy remaining; in the pulsed electron beam 30 is transferred from the electron beam to the collector supply, providing improved electrical efficiency. If a collector supply is not used, the collector 24 is preferably grounded, as indicated by reference numeral 34.

When the electron source 10 is operated in conjunction with a cavity resonator to form an oscillator, the rf energy generated by the pulsed electron beam may be tapped, for example, by an output port 36 to provide an rf output signal.

Figure 2:
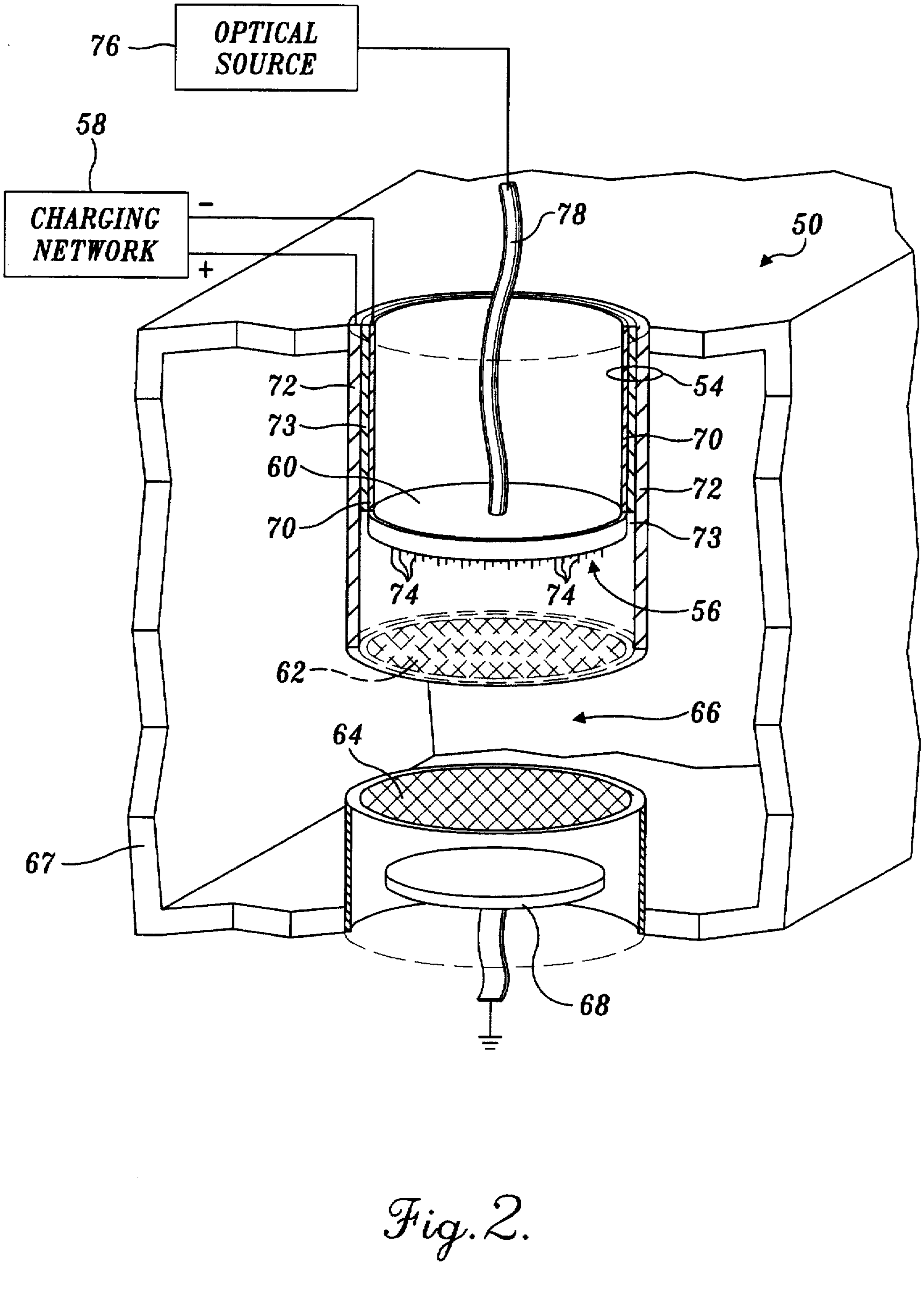
FIG. 2 illustrates an exemplary embodiment of the electron source of FIG. 1.

FIG. 2 illustrates an exemplary embodiment of the electron source 10 illustrated in FIG. 1. An electron source 50 in accordance with the invention may, as discussed above, be used to produce an oscillating output signal or amplify an existing electromagnetic signal. Similar components between the two embodiments have been renumbered for clarity and to emphasize that different configurations of the electron source 10 may be implemented with suitable results, depending upon the specific application and frequency of the electromagnetic signals being produced or amplified.

The electron source 50 includes a coaxial pulse-forming line 54, a cold field-emitting cathode 56, a charging network 58 and a sub-nanosecond-closing solid-state switch 60 that is integral with or positioned in close proximity to the cathode 56. The electron source 50 further includes an anode grid 62 that, in conjunction with a closure grid 64, forms an interaction region 66 between the anode and closure grids 62 and 64. The interaction region 66 is located within a portion of the space occupied by: (1) a cavity if the electron source is utilized to produce a narrow band output signal; or (2) waveguide if the electron source is utilized as a gated wideband amplifier. The cavity or waveguide is partially shown at 67. Electrons emitting from the cathode 56 are injected into an electromagnetic field present in the interaction region 66 in the form of an electron current pulse, and are subsequently collected by an electron collector 68. The collector 68 is located in close proximity to the closure grid 64, on the opposite side of the anode grid 62. The collector 68 is shown coupled to ground, but may also be coupled to a collector supply, as depicted and described above in FIG. 1.

The charging network 58 includes a switched voltage source that operates in the manner of the voltage source $V_s$ and charging switch 28 of FIG. 1. The charging network has positive and negative terminals, that correspond to the positive and negative terminals, respectively, on the voltage source. When the charging network 58 is activated, a circuit is completed between the pulse-forming line 54 and voltage source (not shown), wherein the pulse-forming line is charged to a desirable voltage level. The charging network 58 is generally referred to as being "on" when the circuit between the pulse-forming line and voltage source is closed, and "off" when the voltage source is disconnected.

The pulse-forming line 54 has inner and outer conductors 70 and 72, respectively, that are separated by a dielectric layer 73. Those skilled in the art will recognize that the pulse-forming line is a form of capacitive transmission line, and may also be configured as a stripline or other form of capacitive device. As is shown, the inner conductor 70 couples the negative terminal of the charging network 58 to the solid-state switch 60. The outer conductor 72 couples the positive terminal of the charging network to the anode grid 62. The time required to charge the pulse-forming line is dependent, in part, upon the time constant of the conductors as well as the output capabilities of the voltage source utilized by the charging network 58.

The cathode 56 is comprised of a plurality of electrodes 74 in the form of cylindrical, conical, or otherwise tapered elements that extend outwardly from the lower surface of the cathode. As depicted in FIG. 2, the cathode 56 resembles a pin-cushion. When a voltage is applied between the cathode 56 and anode grid 62, the resultant electric field is concentrated at the tips of the electrodes 74. At a threshold potential, electrons are drawn from the electrodes and accelerated toward the anode grid 62.

The voltage required to begin electron emission will depend upon the spacing between the cathode 56 and anode grid 62, as well as the material comprising the electrodes 74. Actual designs of the electron source 50 employ a 3 kilovolt power source in the charging network and a 3 mil spacing between the cathode and anode grid. In one embodiment, it is observed that electrons begin to emit from the cathode 56 when the electric field is on the order of 40 megavolts per meter at the anode grid. In theory, the concentration effect produced by the electrodes 74 is estimated to increase the local field at the tip of each element to 3 gigavolts per meter. Suitable materials for use as the cathode (and electrodes) include silicon and refractory metals, such as platinum or tungsten. For a very limited number of pulses, ordinary velvet cloth may also be used.

The solid-state switch 60 is preferably an optically initiated semi-conducting switch that is triggered by a laser through an optical source 76 and an optical transmission line such as optical fiber 78. In FIG. 2, the optical fiber 78 passes through the center of the coaxial pulse-forming line 54 to access the switch. Hence, this is at least one advantage of utilizing a coaxial pulse-forming line. In a preferred arrangement, the solid-state switch 60 is integral with the cathode 56 to minimize circuit reactances. In this arrangement, the solid-state switch 60 provides a rapid ram-on time, e.g., in the range of tens to hundreds of picoseconds, while switching suitable current levels, i.e., kiloamps of current. Rapid turn-on times and the ability to switch high current levels become increasingly important when using the electron source 50 to produce or amplify high frequency signals in the microwave frequency range. Suitable materials that may be used to construct the solid-state switch 60 include silicon, gallium arsenide (GaAs), and indium phosphide (InP). Fabrication of such switches is a technique known to those skilled in the art.

Figures 4A, 4B, 4C:
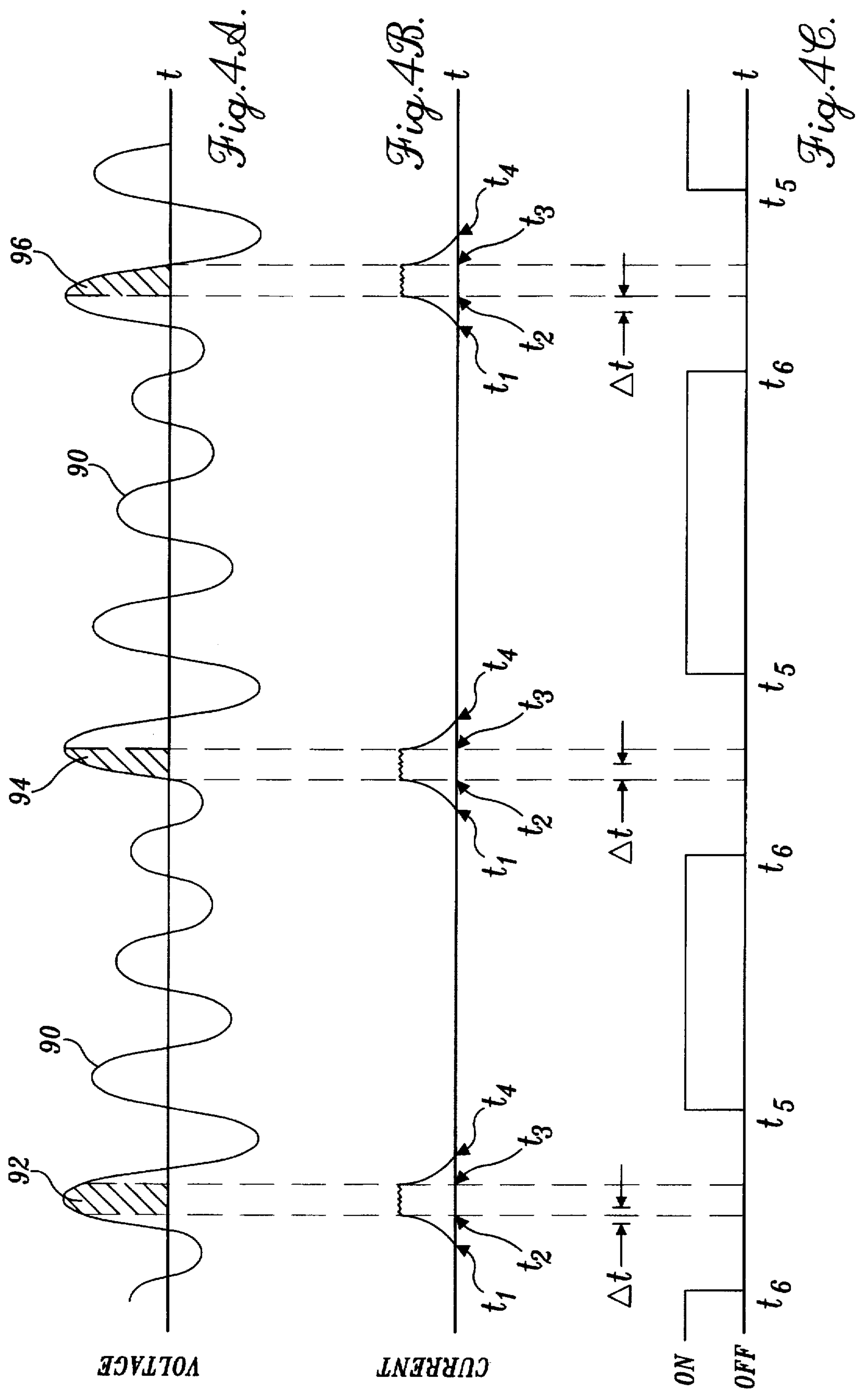
FIGS. 4A–4C are timing diagrams illustrating the temporal relationship between an rf output signal; the solid-state switch; and the pulse-forming line, respectively, of the oscillator of FIG. 3 as it is operated at a firing-rate that is some sub-multiple of the fundamental frequency of a cavity resonator.

The switching of the solid-state switch 60 must be synchronized to the interacting electromagnetic field to ensure that the electrons comprising the pulsed electron beams emitted by the cathode 56 add energy to the electromagnetic field present in the interaction region 66, rather than remove energy from the field. Generally, the net energy content of the cavity or waveguide surrounding the electron source 50 will increase as long as the pulsed electron beam is resident in the interaction region for a time interval that is less than the duration of the half-cycle of the rf wave. In an oscillator, the half-cycle of the rf wave is dependent upon the resonant frequency ($f_0$) of the cavity. In FIG. 4A, the portions of the resultant sinusoid that decelerate the electrons comprising the electromagnetic field are the shaded areas above the horizontal line (x-axis), which is indicative of time t. The best overall efficiency occurs when the pulsed electron beam is injected during the opposing quarter-cycle of the rf wave, i.e., during the quarter-cycle when the field is maximally decelerating the electrons. As described more fully below, this region is depicted by reference numeral 92 of FIG. 4A. It is noted that the time-analyzed current in the electron pulse is not critical, so long as the arrival time and duration constraints discussed above are satisfied.

As was discussed in reference to FIG. 1, the solid-state switch 60 will remain closed until the charge is released from the pulse-forming line 54. Thus, the electrical characteristics of the pulse-forming line determine the duration of the pulsed electron beam. These characteristics may be manipulated to ensure efficient energy transfer from the pulsed electron beam to the electromagnetic field, i.e., that the pulsed electron beam is present only during the half-cycle of the rf wave that decelerates the electrons.

Figure 3:
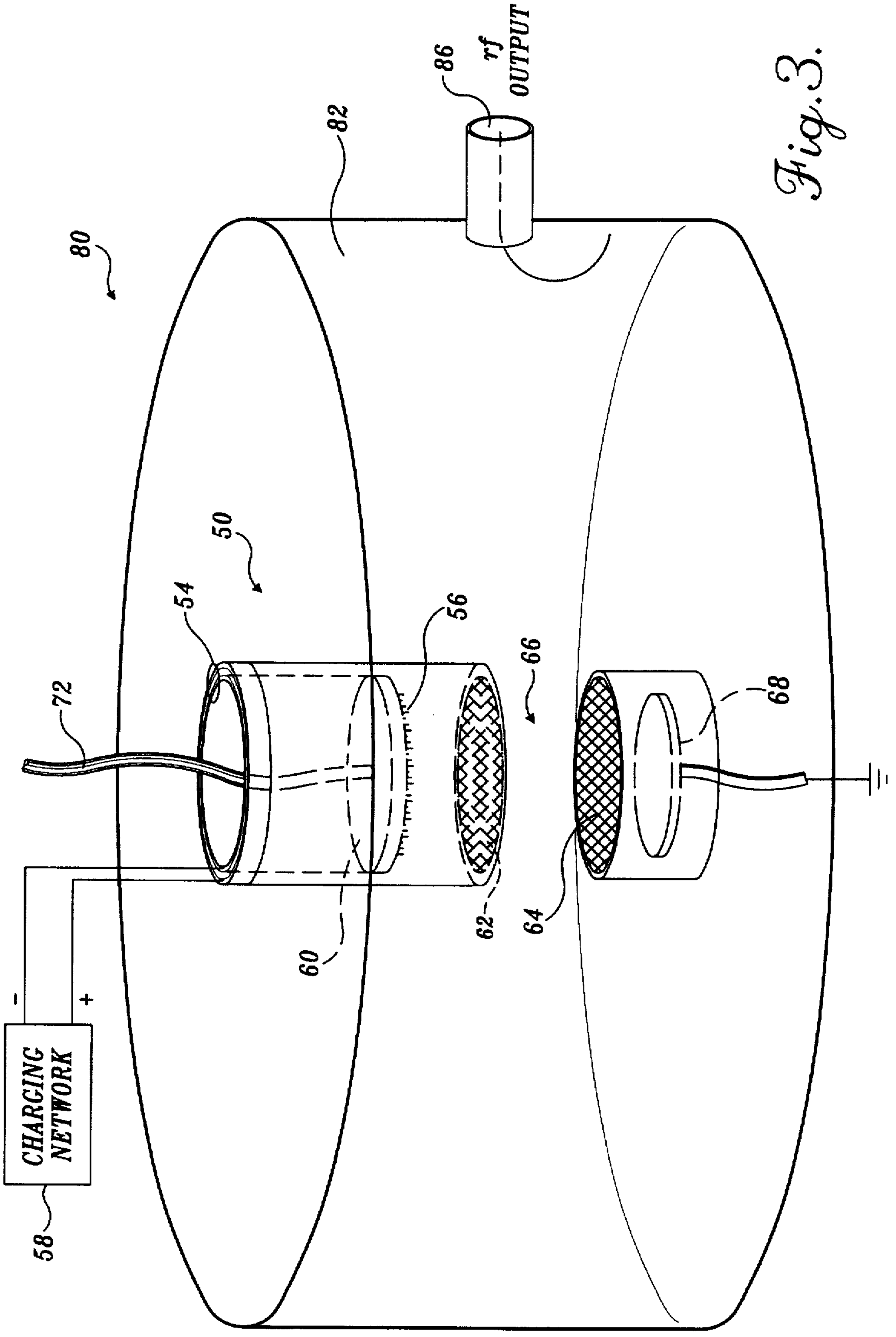
FIG. 3 is a pictorial representation of an oscillator in accordance with the invention.

FIG. 3 illustrates a first preferred application of the electron source 50 utilized in conjunction with a cavity resonator 82 to produce a microwave frequency oscillator 80 for generating high frequency rf signals. The oscillator 80 provides an rf output through an output port 86. The oscillator 80 is a tunable oscillator with the frequency of the oscillations being controlled by the resonant frequency of the cavity 82. Those skilled in the art will appreciate that means of changing the resonant frequency of the cavity mechanically or electronically are known in the art.

The operation of the oscillator 80 is schematically described in FIGS. 4A–4C. The timing diagrams assume that the electron source 50 is being triggered at a constant time interval that is an integer multiple of the cycle duration at the fundamental frequency ($f_0$) of the cavity resonator. The integer multiple is four in the illustrations. The horizontal axes of FIGS. 4A–4C are calibrated in time (t). The vertical axes of FIGS. 4A–4C represent, respectively, the peak voltage of the output of the oscillator, the current through the solid-state switch, and the on-off characteristics of the pulse-forming network.

With reference to FIG. 4A, the output 90 of the oscillator is illustrated as a sinusoidal wave that is exponentially decaying at the fundamental frequency $f_0$ of the cavity resonator 82. The decay is a result of the assumption that the solid-state switch is being triggered at a rate that is slower than $f_0$. As will be readily appreciated, the output of the oscillator 80 will be a sine wave of constant amplitude if the solid-state switch is triggered at the fundamental frequency $f_0$ of the cavity.

With reference to FIG. 4B, the solid-state switch is triggered at a command-instant, just prior to time $t_1$, by activating the optical source 76 which sends a laser pulse through the optical fiber 78. After a brief delay, the solid-state switch 60 begins to conduct. The current through the switch increases at a time interval, i.e., from $t_1$ to $t_2$, which is generally referred to as the rise-time of the switch, until the solid-state switch is substantially closed, thereby fully coupling the pulse-forming line of the charging network 58 to the cathode 56. At some time between $t_1$ and $t_2$, the electric field between the cathode 56 and anode grid 62 reaches a threshold value that drives the cathode to emit electrons in the form of an electron current pulse into the interaction region of the cavity. The length of time that the switch remains closed, from $t_2$ to $t_3$, constitutes the length or duration of the electron current pulse. Once the pulse-forming line within the charging network 58 has been fully discharged, the solid-state switch 60 begins to open, as shown at time 14, and is eventually non-conducting.

The above-described cycle is repeated with each firing of the optical source 76. The switch closure time $t_2$ is uncertain by a small time interval $\Delta t$, caused by the physics of the optical source 76 that issues the firing signal, i.e., the variance in the time period between firing the optical source and the signal reaching the switch, just prior to $t_1$, and the physical closing process within the solid-state switch 60 once a laser pulse has been received by the solid-state switch, i.e., the time between $t_1$ and actual switch closure at $t_2$. The $\Delta t$ uncertainty instant is typically picoseconds in magnitude. The effect of the above-described timing; uncertainties is shown in the second and third conduction cycles (FIG. 4A) as leading and lagging firings, respectively. The timing uncertainties may result in reduced energy transfers as indicated by the somewhat smaller shaded portions 94 and 96, in FIG. 4A, relative to the shaded portion 92.

The on-off characteristics of the charging network are illustrated in FIG. 4C. The charging network is off (i.e., the electrical supply is disconnected) during the time interval that the solid-state switch 60 is closed to prevent the solid-state switch from remaining closed after the desired pulse duration. The charging network begins to charge the pulse-forming line at time $t_5$, after the solid-state switch has become fully open. Once the pulse-forming line is charged, the charging network is turned off at time $t_6$. Thereafter, the optical source may again be issued, restarting the sequence.

The most efficient operation of the oscillator occurs when the solid-state switch is triggered so that the electron pulse resides in the cavity during the maximally decelerating portion of the oscillating electromagnetic field, i.e., during the top quarter-cycle or 90° of the sinusoidal cavity field. The time period is indicated by the shaded portion 92 of the output 90 shown in FIG. 4A. Should the electron pulse be present at anytime during the full one-half decelerating cycle of the sine wave, there will be a net increase in the energy of the electromagnetic field within the cavity, although the electron pulse duration is most efficient if it occurs during the top quarter-cycle. An electron pulse having a duration greater than one-half cycle will begin to extract energy from the electromagnetic field and is thus inefficient.

The effect of the small command instant uncertainty, Δt, on the transfer efficiency is illustrated in the second and third shaded portions 94 and 96, respectively, of the output 90 shown in FIG. 4A. In the shaded portion 94, the switch closure was Δt/2 too early from the optimum closure (illustrated as the shaded portion 94 in the first conduction cycle). In the shaded portion 96, the switch closure was Δt/2 too late. Because the energy transfer efficiency is sensitive to the firing command-instant uncertainty, it is important that the uncertainty be kept small. Laser initiation of the solid-state switch helps to keep the uncertainty to a minimum.

Figure 5:
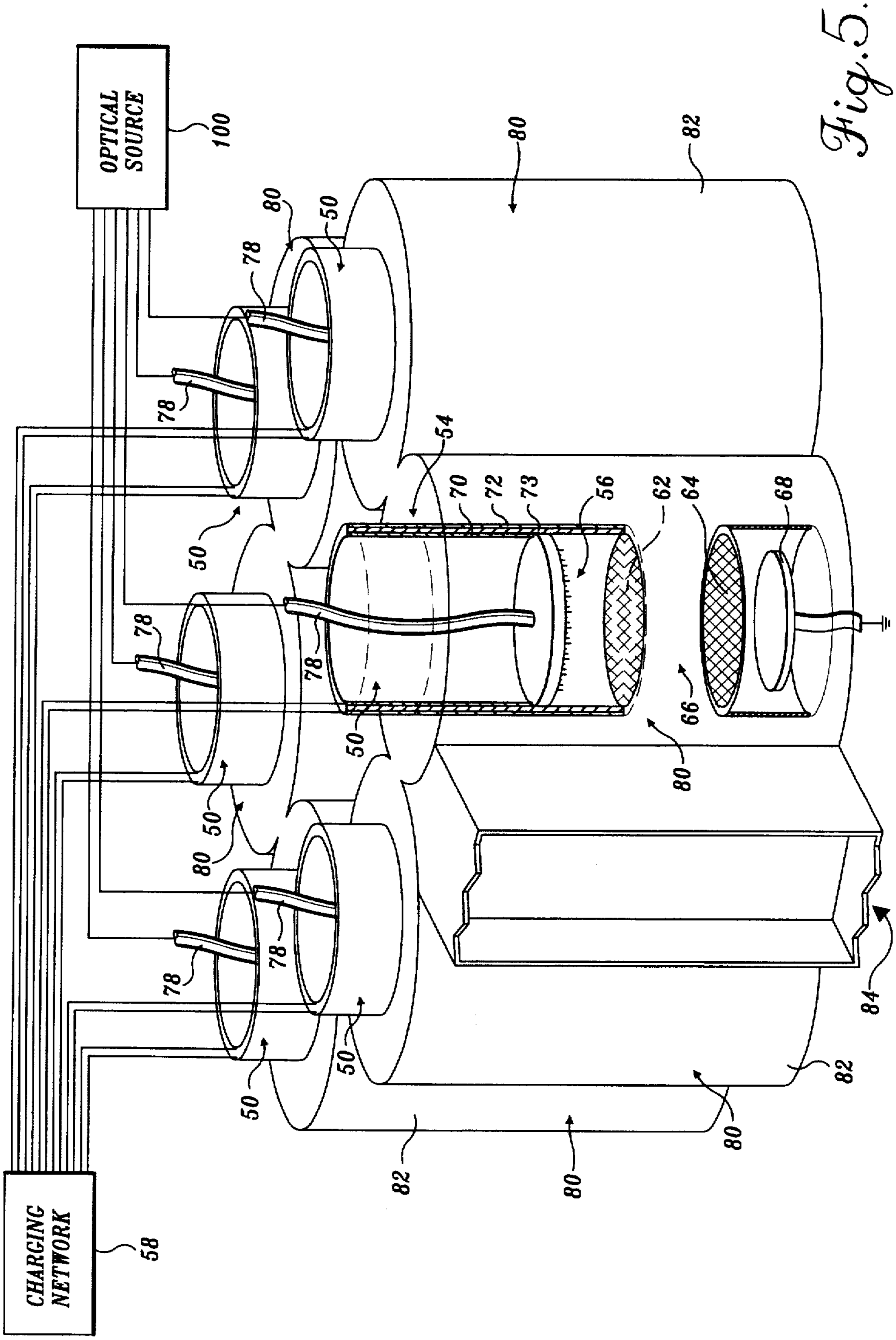
FIG. 5 is a pictorial representation of the invention in which a plurality of oscillators of the type shown in FIG. 3 are coupled together to increase their output capabilities or repetition frequency.

FIG. 5 illustrates a collection of six identical electron sources 50 or oscillators 80, each having their accompanying resonant cavities 82 coupled to one another in accordance with the invention. The collection of oscillators 80 has a single output in a waveguide 84. When used in a first mode, the collection of electron sources affords increased peak output power over a single device. More particularly, increased peak output power is provided when two or more of the electron sources are fired concurrently. In a second mode, the electron current pulses are triggered sequentially, thereby increasing the time-window in which to charge the charging networks 58 associated with each of the electron sources. In the second mode, at least two of the electron sources must be triggered at different time intervals. Thus, one or more of the pulse-forming lines are charging as one (or more) of the electron sources are being fired.

Figure 6A:
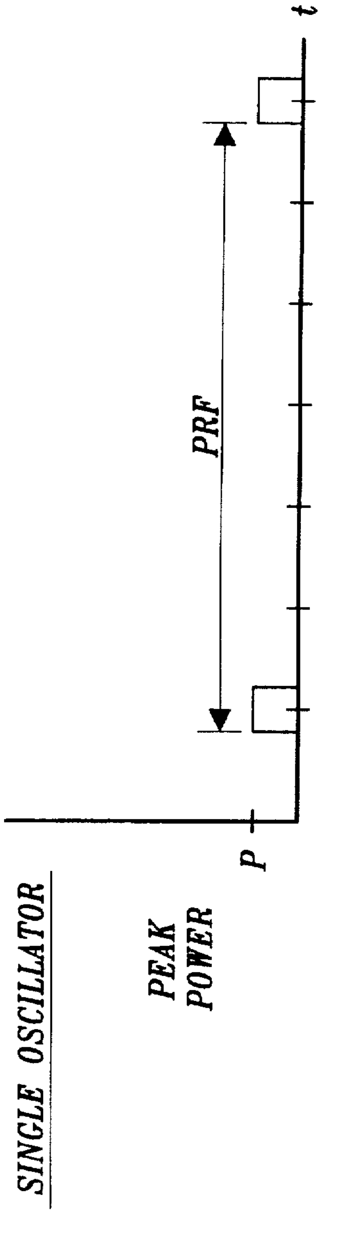
FIGS. 6A, 6B, and 6C are graphs illustrating the trade-off between peak power and pulse repetition frequency available from the oscillator of FIG. 3 and the oscillator of FIG. 5 operated in simultaneous and sequential modes of operation.
Figure 6B:
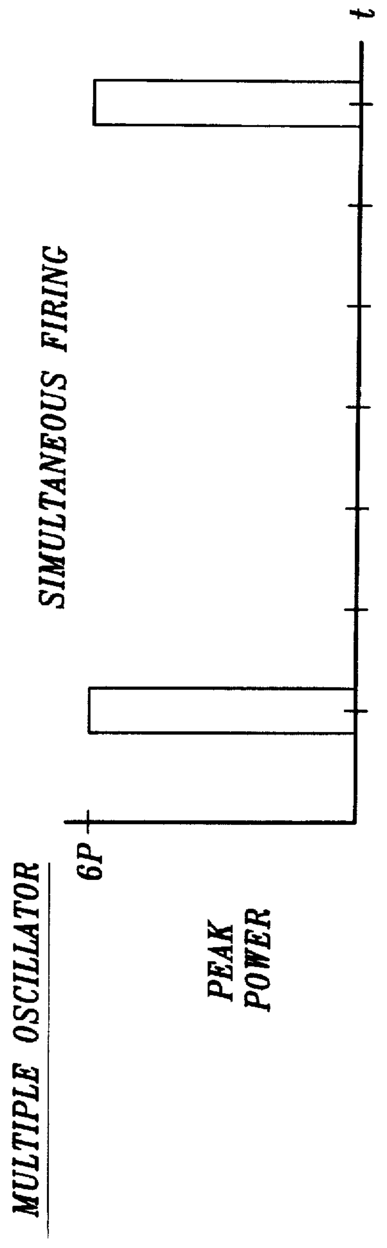
Figure 6C:
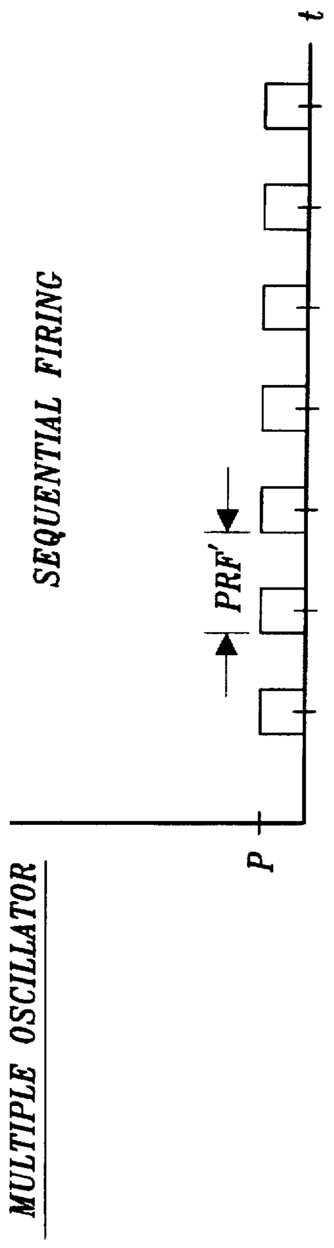

The tradeoff between peak power and pulse repetition frequency (PRF) is illustrated in FIGS. 6A–6C. As shown in FIGS. 6A and 6B, for a given PRF, the use of six simultaneously fired oscillators instead of a single oscillator results in a six-fold increase in peak power. If the six oscillators are, on the other hand, sequentially fired at a PRF that is one-sixth the original PRF, as shown in FIG. 6C, the peak power for each firing will be one-sixth that available from the simultaneous firing shown in FIG. 6B.

The cavities 82 of each oscillator 80 in FIG. 5 are coupled together by techniques well known in the art to lock the cavities together in phase. For example, adjacent cavities may be coupled by a single hole (loosely coupled), multiple holes, or a slot that extends along the length or a portion of the length of the cavities (tightly coupled). The amount of coupling will depend upon the application, and is designed to lock the cavities in phase while maintaining the quality factor (Q) of the cavities. The resultant rf output may be provided through the output waveguide 84 or an aperture similar to that depicted in FIG. 3.

The collection of electron sources 50 includes an optical source 100 or laser that triggers each electron source at the proper command-instant, depending upon the mode of operation of the collection. In the first mode of operation mentioned above, optical source 100 triggers the electron sources simultaneously. In the second mode of operation, the electron sources are activated at different times, e.g., the optical source 100 may trigger electron sources in a clockwise direction. The total energy of the multiple-oscillator arrangement is divided among each of the individual oscillators 80 in the second mode of operation. This commutation adds energy to all the cavities while allowing more recovery time for each of the individual pulse-forming lines.

As will be appreciated by those skilled in the art, portraying six electron source/cavity pairings is purely illustrative. Subject to the condition that the coupled cavity configuration has the desired resonant frequency or frequencies, any number may be coupled together.

Figure 7:
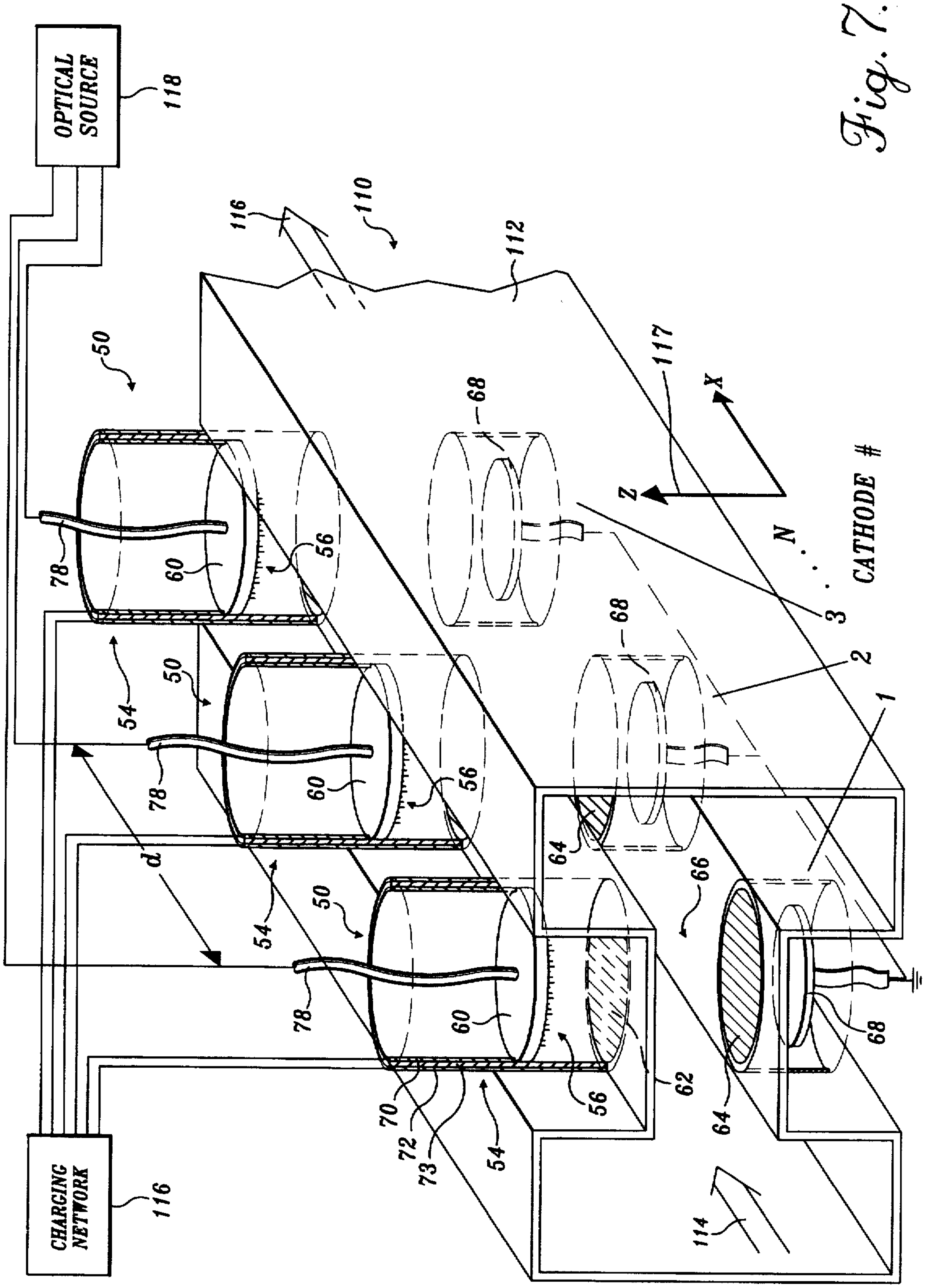
FIG. 7 is a pictorial representation of a first exemplary rf source in accordance with the invention.

FIG. 7 illustrates an rf source 110 in accordance with the invention. As will be appreciated by the following discussion, the rf source 110 may be implemented as an amplifier or an oscillator, e.g., an injection-locked oscillator. The rf source 110 includes a plurality of the electron sources 50 as illustrated in FIG. 2 and discussed in the accompanying text. For illustrative purposes, the electron sources 50 are positioned along a section of a transmission line or ridge waveguide 112. The input of the waveguide is illustrated by reference numeral 114 and the output by reference numeral 116. An optical source 118, similar to the optical source 100 of FIG. 5, transmits firing signals through the optical fibers 78 at the proper command instant such that the electron current pulses contribute energy to the electric field in the waveguide 112. A charging network (circuit) 116 recharges the pulse-forming lines 54 of each electron source 50 between firings of the optical source 118.

Figure 8:
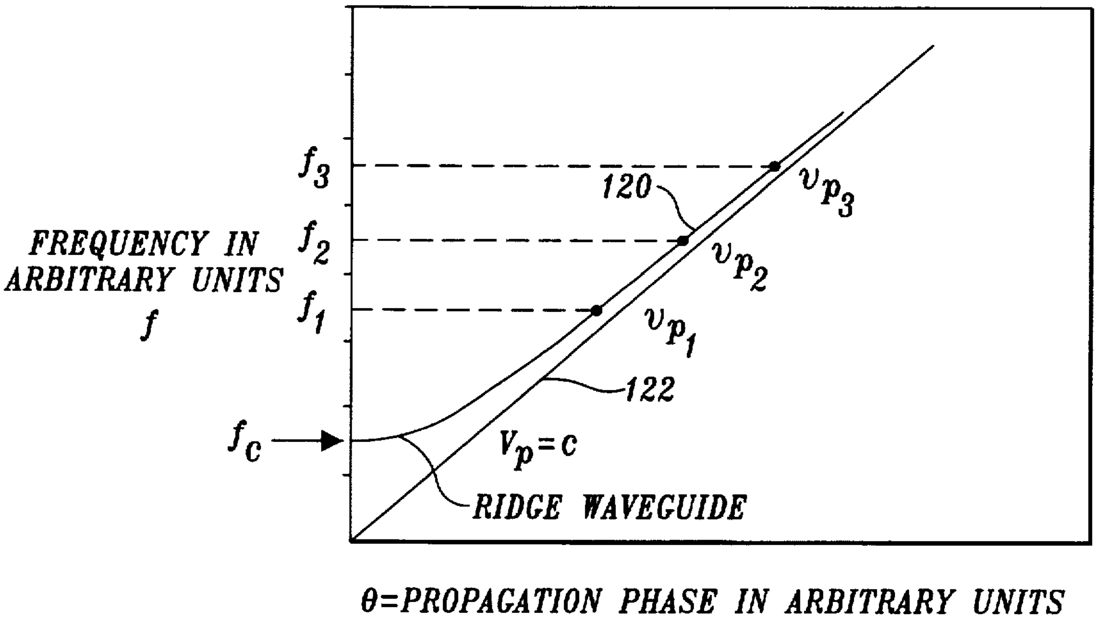
FIG. 8 is a propagation diagram for the rf source shown in FIG. 7.

The output of the rf source 110 of FIG. 7 is characterized by the propagation diagram of FIG. 8. The propagation diagram of FIG. 8 illustrates a wideband circuit with wave propagation along the long (x) axis of the waveguide. Frequency is represented by the vertical (y) axis of the propagation diagram. As shown in FIG. 7, electron pulses are injected transversely along the z axis of the ridge waveguide, as indicated by reference numeral 117. The circuit is matched to the input and output wave by a broadband matching network, not shown, by methods known to those skilled in the art. In FIG. 8, the phase velocity $v_p$ (reference numeral 120), which is at a frequency above the cutoff frequency $f_c$, rapidly approaches the velocity of light $v_p$=c (reference numeral 122) as the frequency and/or propagation phase is increased. Unloaded waveguide circuits, when operated well above the cutoff frequency $f_c$, are characterized by a nearly constant phase velocity, $v_p \approx c$, over a relatively wide band. Closer to the cutoff frequency, where the phase velocity is increasing, if the command instant is properly timed by sampling the input frequency, wave generation over a broadband can be obtained.

The rf source depicted in FIG. 7 exhibits the following inherent advantages: (1) the interaction with the unloaded waveguide circuit is broadband and independent of beam voltage; (2) the cold field-emitting cathode is capable of high current density, i.e., ~100 a/cm$^2$ or more, allowing low voltage of operation, wherein x-ray shielding is not required, for a peak power in the multimegawatt region; (3) the pulsed current electron source inherently provides highly efficient interaction within the rf gap of the ridge waveguide, resulting in a compact design without the need for a focusing magnet, since there is no drier region needed, as in a conventional Klystron oscillator; (4) the power added by each electron source can be tailored from electron source to electron source, resulting in optimum power transfer along the device and tailoring for space charge effects; and (5) the cathode-to-cathode trigger signal can match a wave with a phase velocity $v_p$ above the velocity of light, contrary to conventional traveling wave amplifiers where interactions are limited to velocities less than that of light.

In its most natural mode of operation, but not exclusively so, the rf source 110 is suited for short pulse generation and amplification, where the number of cathodes is equal to the number of cycles to be amplified. With repetition rates of well under 100 kilohertz, this will still result in average powers of several kilowatts for the voltages considered (up to 75 Kv), with peak powers in the tens of megawatts. Such short pulses have the advantage of improved range resolution and improved clutter performance in radar systems.

Figure 9A:
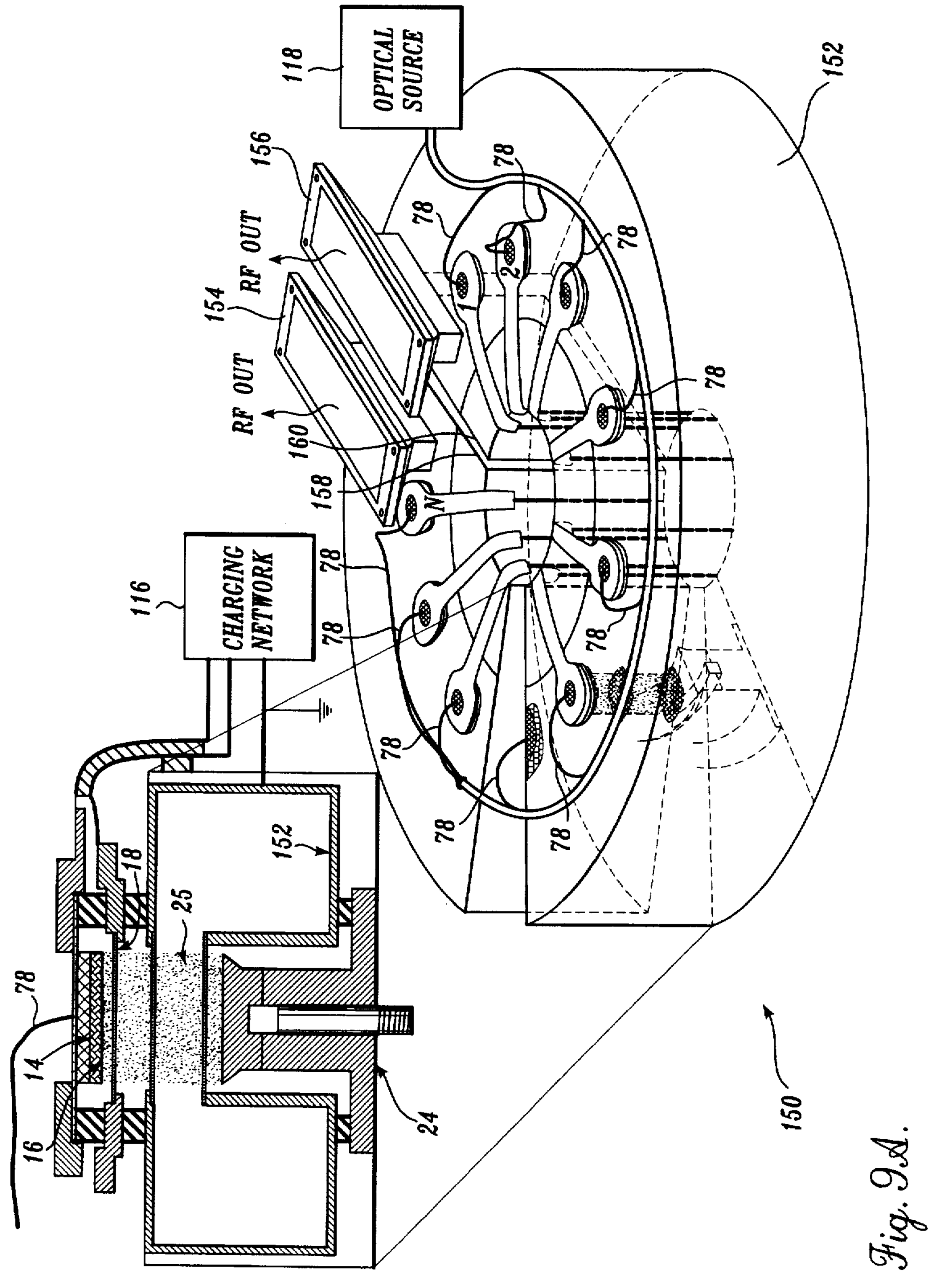
FIGS. 9A–9B are pictorial representations of a second exemplary rf source in accordance with the invention, with FIG. 9B depicting various modes of operation.

FIG. 9A depicts a circular format of an rf source 150 in accordance with the invention, including a circular transmission line 132 having a plurality of electron sources 50 spaced equally along the circumference of the transmission line. As described in FIG. 2 and the accompanying text, the electron sources 50 integrate a field-emitting cathode and a switch as a single semiconducting unit. As will be appreciated from the foregoing discussion, the cathode of each electron source 50 may be gated or ungated; an ungated version is shown, with the anode voltage selected to optimize the optical switch performance. A gated version of the cathode is similar to the ungated version shown, but also includes a gate electrode inserted between the field-emitting cathode 56 of FIG. 2 and anode grid 62, in a manner entirely similar to a grid in a conventional triode. The addition of such a gate electrode enables the field-emitting cathode to operate at reduced voltages.

The electron source 150 includes two output ports 154 and 156, located on each side of a pair of walls 158 and 160, which dissect the transmission unit 152. The electron source 150 also includes a charging network 116 and an optical source 118, as described in relation to FIG. 7.

A linear mode or bulk avalanche mode may be selected for the switch, based on optical drive requirements, switch performance, and ease of integration with the field-emitting cathode. The energy in the beam is selected by adjusting the post-acceleration voltage, i.e., the voltage between the anode and the post-acceleration grid. Some variants of the interaction circuit may be, utilized to optimize the output interaction with the gated beams produced by the electron sources 50, such as two ridge waveguides back to back, i.e., one on top of the other and inverted, to optimize rf extraction from the beam.

In the absence of an rf input into the rf source 150, each gated beam will initiate a current pulse, the duration of which being determined by the characteristics of the charging network 116. Each current pulse produced by one of the electron sources 50 will generate an rf wave traveling in each direction, i.e., clockwise and counterclockwise, around the transmission line 152 of the rf source 150. The rf outputs from each rf wave may be combined using a waveguide network known to those skilled in the art. It should be noted that, since the current pulse is highly bunched, the output current waveform will be highly non-sinusoidal having a high harmonic component. This current "wavelet" will couple to the wide band interaction circuit as determined by the current component at a given frequency, and the impedance of the interaction circuit at this frequency. If the wavelets from each gated beam are timed in a sequence such that the wavelet separation is at a period of the frequency of interest, the wavelets will add energy to the newly formed input wave, which will be traveling at the fundamental frequency of the interaction circuit. It is noted that the use of bandpass filters in the output enables either fundamental or harmonic frequency components of the resultant wave to be selected.

Figure 9B:
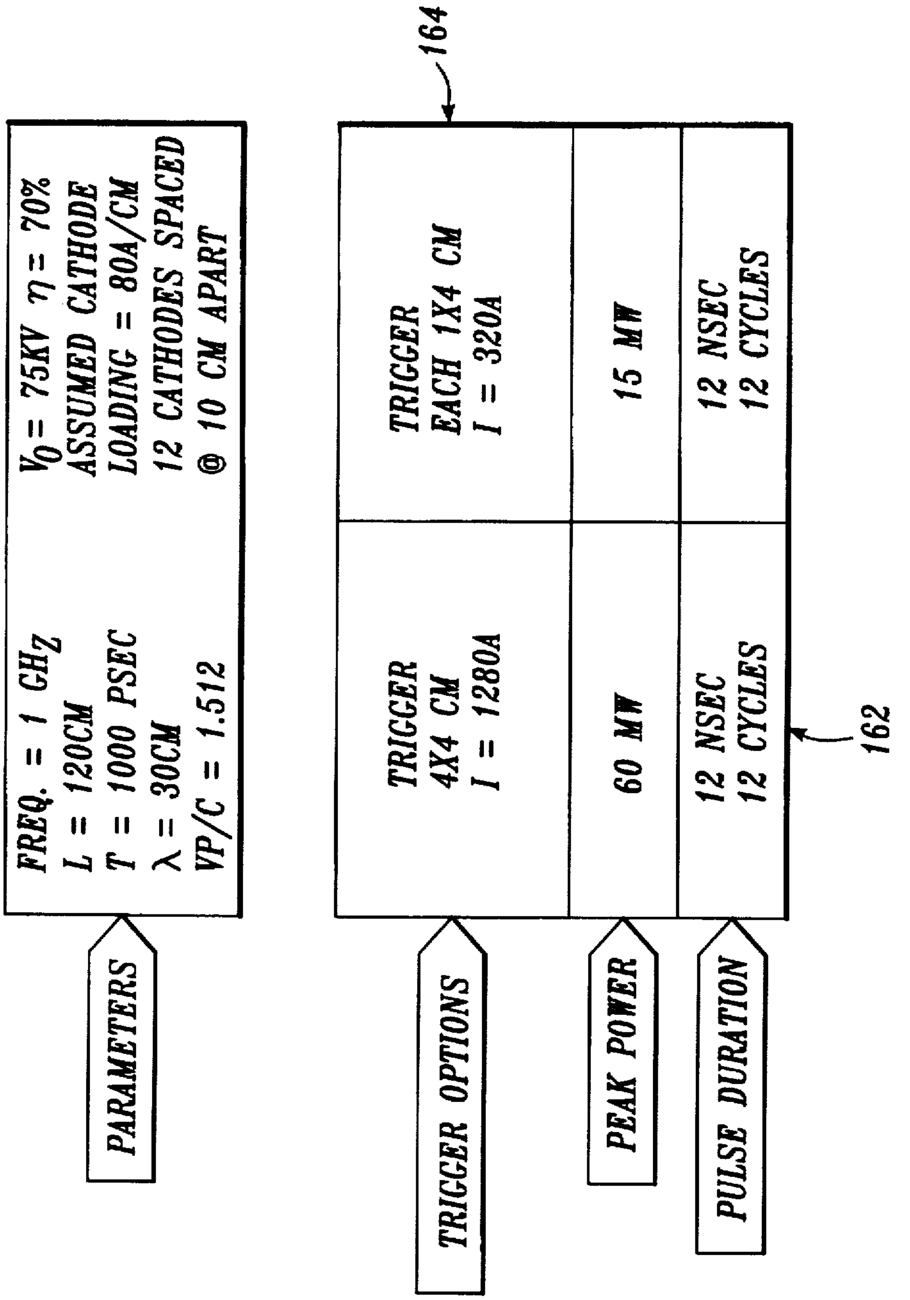

FIG. 9B depicts typical operating parameters for the rf source 150 and the resultant peak power and pulse duration values attainable with those parameters. The parameters include an operating frequency of 1 GHz wherein the post-acceleration voltage is 75 Kv and an assumed efficiency ($\eta$) of 70%. There are 12 electron sources spaced approximately 10 cm apart and the current out of the feed-emitting cathodes is approximately 80 a/cm$^2$. In column 162, each cathode is 4×4 cm (16 cm$^2$), with a resultant current of 1280 Amperes (A). This results in a peak power of 60 Mw computed by multiplying I(V)($\eta$) or 1280(75)(0.7). In column 164, each cathode is 1×4 cm (4 cm$^2$), with a resultant current of 320A ;and a peak power of 15 Mw. However, the pulse duration has been increased fourfold (to 48 ns). As can be seen, through selection of the area of the cathode, the peak power may be varied within a single device. By increasing the pulse duration, as in column 164, the same resultant waveform is obtained as that in the larger, higher powered electron sources. With projected current densities of field-emitting cathodes, peak powers in excess of 50 megawatts at voltages below 75 Kv can be anticipated.

Figure 10B:
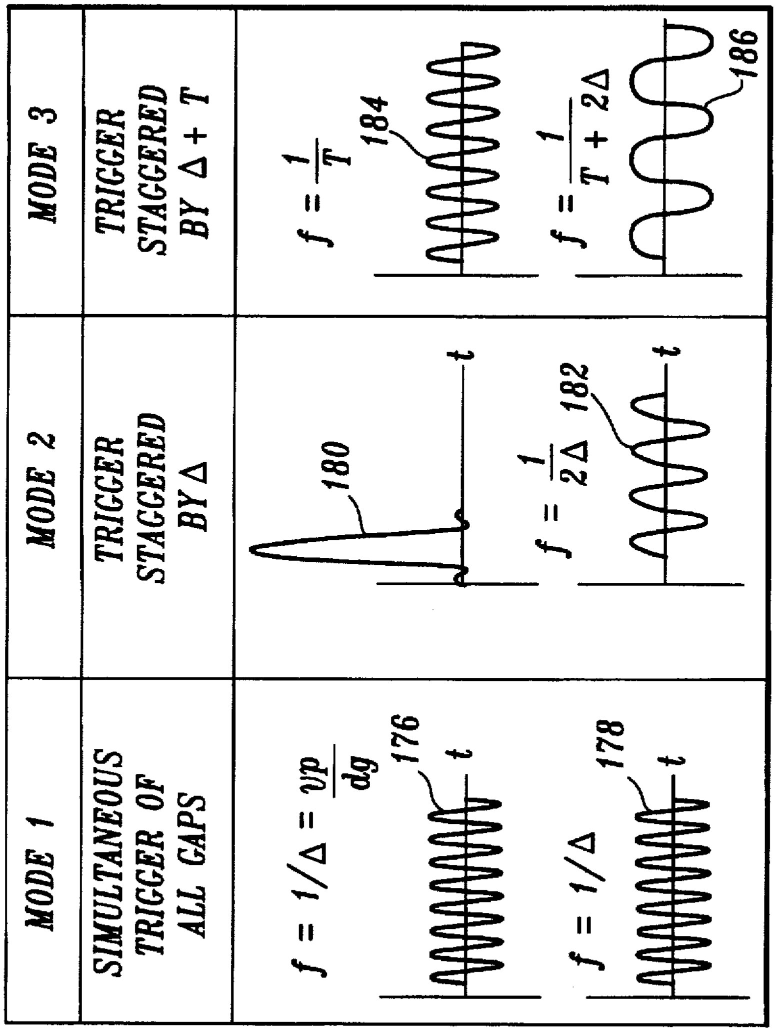
Figure 10A:
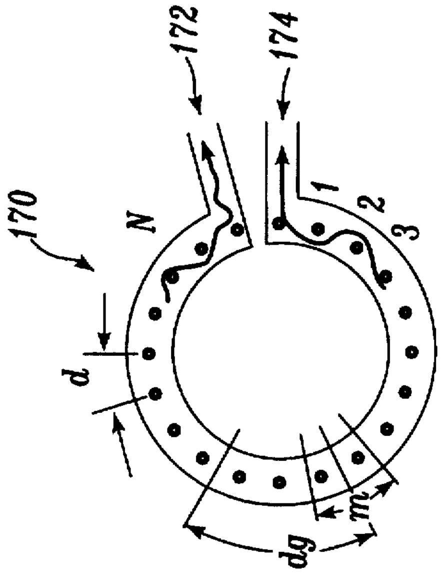

FIG. 10A depicts an rf source 170 in accordance with the invention. The rf source 170 includes two outputs 172 and 174; the resultant waveforms at output 172 being produced by waves traveling clockwise and the resultant waveforms at output 174 being produced by waves traveling counterclockwise. The rf source 170 is similar to the rf source 150 illustrated in FIG. 9A, but instead of having a N separate cathodes, includes a single, continuous circular cathode that has separate, closely spaced selectively triggerable segments. The versatility of triggering selectable cathode segments, or triggering them in several groups around the circumference of the rf source, provides tremendous flexibility in a single device. The operating characteristics for three modes of operation for the rf source 170 are shown in FIG. 10B.

In Mode 1, a number of the cathode segments are triggered simultaneously. With simultaneous triggering, the waveforms produced at both outputs 172 and 174 have the same base frequency. These are indicated by reference numerals 176 and 178. It is noted that, since the resulting waveforms have the same base frequency, they can be added directly, if desired. Everything else being equal, the peak power of the rf source is dependent upon the number of segments triggered, the limit being determined by the spatial extent of the segment, not to exceed approximately $\lambda/5$ at the desired frequency. This is mainly due to efficiency considerations. The spacing between selected cathode segments or groups of segments, dg, is set in accordance with the desired frequency and its phase velocity in the interacting circuit ($f=v_p/dg$).

In Mode 2, the cathode segments are triggered sequentially. The time between triggering each cathode is set equal to $\Delta=dg/v_p$. In this case, the output in one direction, i.e., clockwise, adds to a superposition of all wavelets to form a spike 180 at output 172, and in the other direction adds to form a waveform 182 at output 172 having a base frequency of $f=\frac{1}{2}\Delta$.

In Mode 3, the trigger is delayed by ($\Delta$+T) from cathode segment to cathode segment, producing a waveform 184 at output 172 having a frequency f=1/T and a waveform 186 at output 174 having a frequency $f=1/(T+2\Delta)$. The two waveforms 184 and 186 may be combined to produce a frequency difference of f1–f2 in the output, which may be of interest in certain applications, e.g., high-power microwave penetration of electronic equipment.

Those skilled in the an will appreciate that the waveform characteristics shown in FIG. 10B are applicable to the rf source 150 of FIG. 9A.

FIG. 10C illustrates the parameters for the rf source 170 in each mode of operation, including relative peak power, cathode area triggered, burst duration, and number of cycles. For purposes of the exemplary parameters listed, it is assumed that the rf source 170 has 80 cathode segments, each 1 cm×4 cm, spaced 1.5 cm along the circumference of the rf source. The statistics under Mode 1 in FIG. 10C refer to either of the outputs 172 or 174, as these are the same. The statistics across from Modes 2 and 3 refer to output 174 only. Given the parameters listed, the average power is 30 Kw. In mode 3, the "beat" frequency $\Delta f$ is that exhibited by combining outputs 172 and 174.

In principle, it is possible to generate both "positive" and "negative" gated beams by configuring a set of interleaved cathode segments with cathode and collector assemblies alternately reversed with respect to the ridge waveguide. A given wavelet cycle would now be synthesized with a positive and negative pulse, rather than just one positive pulse. This configuration enhances the amplitude of the current component which couples to a given output frequency.

As seen from the propagation diagram of FIG. 8, the phase velocities are defined by the frequency, as is the duration of one cycle (1/f), so that, by specifying a given frequency (or sampling it), the proper time, sequence is "commanded" to generate or amplify only that frequency. Thus, any frequency within geometric and higher order mode constraints in the wide band of the ridge waveguide can be synthesized.

Figure 11:
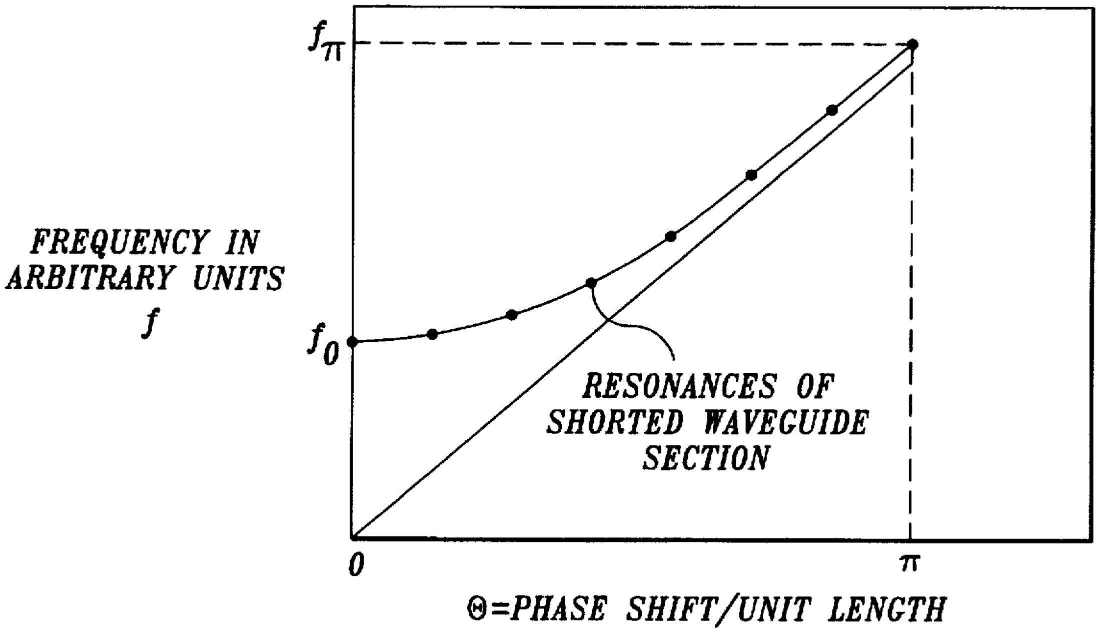
FIG. 11 is a propagation diagram for the rf source shown in FIG. 7.

With reference again to FIG. 7, another mode of the rf source 110 is when the circuit is shorted at the input and output, with the input removed, which will result in a cavity having a specified number of resonances corresponding to the length of the transmission line. The electron sources 50 are then selectively triggered to enhance particular resonances in the circuit. For illustrative purposes, we will consider two such resonances: the "zero" mode resonance and the "$\pi$" mode resonance. These resonances are closely related to the propagation diagram of FIG. 8, as illustrated in FIG. 11. By switching the cathodes to favor one of these field distributions, oscillations of this "cavity" will build up at either zero-mode frequency $f_0$ or $\pi$-mode frequency $f_\pi$. For the $f_\pi$ resonance, alternate cathodes are switched 180 degrees out of phase, or if desired, the cathode-collector position is reversed, with alternate cathodes being on "top" and "bottom" of the waveguide. In this method of operation pulse-to-pulse frequency diversity is realized. By increasing the cavity length, more oscillating modes occur, which are closely spaced in frequency, so that a nearly continuous separation of pulse-to-pulse frequencies in a given band can be obtained.

Figure 12:
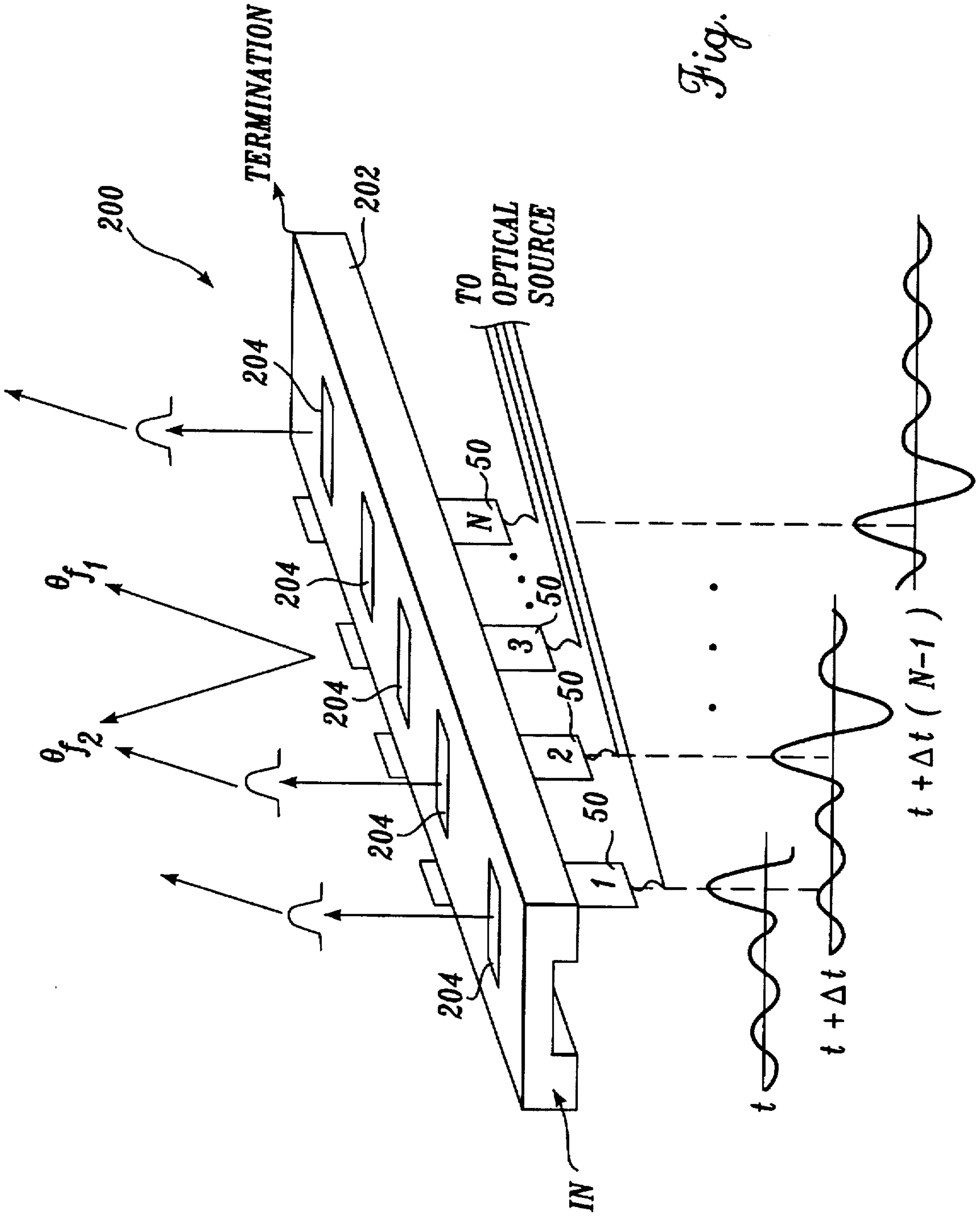
FIG. 12 is a pictorial diagram of a fourth exemplary rf source in accordance with the invention.

FIG. 12 illustrates an rf source 200 in accordance with the invention, including a transmission line or ridge waveguide 202 and a plurality of electron sources 50 spaced equally along the length of the transmission line. The ridge waveguide 202 includes radiating apertures 204 that are proximate to each electron source 50. The rf pulse generated at each electron source is radiated into space in exactly a time-delayed manner to form a beam in a direction $\theta^1$ by a waveform traveling in one direction, and $-\theta^1$ by a waveform traveling in the other direction. Thus, dual beams that are steerable by selection of the time delay may be generated. Different values of $\theta$ are obtained by changing the frequency. The detailed geometry of the radiating slot, and its location in either wall (top or side), will be determined by the specific application and desired pattern.

Another application of the rf sources disclosed herein is as an input to an rf storage circuit (cavity). In this mode, the resonant cavity is connected to a load through a fast switch (not shown), such as a semiconducting silicon or gallium arsenide light-activated switch. The electron beam sources are triggered at any convenient period, building up the radio frequency voltage in the cavity. When the voltage approaches, but does not quite reach, the breakdown value, the external switch is triggered, "dumping" the entire energy stored in the cavity in a giant pulse to the load. High peak powers are attainable by proper timing of the external switch and the rate at which the electron beam sources are triggered. This mode of operation presents another way of exploiting the electron beam source properties in a manner to efficiently build up oscillations inside a cavity.

While the preferred embodiment of the invention has been illustrated and described, it will be appreciated that various changes can be made therein without departing from the spirit and scope of the invention. For example, to achieve specific designs, the waveguide interaction circuit may be modified by periodic loading to achieve specific bandpass characteristics, gap impedances and wave admittance to optimize coupling to the gated beam.

The embodiments of the invention in which an exclusive property or privilege is claimed are defined as follows:

1. An apparatus for generating a plurality of electrons in the form of an electron current pulse, comprising:

(a) an anode grid;

(b) a cold emission cathode, positioned in close proximity to the anode grid, the cathode including means for emitting electrons in response to a voltage difference between the cathode and the anode grid;

(c) first and second conductors, across which a voltage difference may be established, the first conductor being coupled to the anode grid;

(d) a switch, coupled between the cathode and the second conductor, for selectively connecting the second conductor to the cathode and allowing a voltage difference to be applied between the cathode and anode grid such that electrons are emitted from the cathode as an electron current pulse; and (e) a closure grid, positioned opposite the anode grid, and an interaction region, defined between the anode grid and the closure grid.

2. The apparatus of claim 1, wherein the apparatus is for generating the electron current pulse in response to the triggering of an activation signal and wherein the switch can be closed to connect the second conductor and cathode and opened to disconnect the second conductor and cathode, and the maximum delay between the triggering of the activation signal and the closing of the switch being of the order of twenty picoseconds.

3. The apparatus of claim 1, further including an electron collector, positioned adjacent the closure grid but outside the interaction region, for collecting the electrons in the electron current pulse after they traverse the interaction region.

4. The apparatus of claim 1, further including a resonating cavity that establishes an electromagnetic field in the interaction region of the apparatus.

5. The apparatus of claim 1, further including a resonating cavity for use in producing an oscillating electromagnetic field, the resonating cavity being in communication with the interaction region such that an electron current pulse entering the interaction region interacts with the oscillating electromagnetic field in the cavity to transfer energy from the electrons forming the electron current pulse to the electromagnetic field.

6. The apparatus of claim 1, wherein the first and second conductors comprise a pulse-forming line for storing an electrical charge responsible for establishing the voltage difference between the cathode and anode grid, the duration of the electron current pulse being dependent upon the pulse-forming line configuration.

7. The apparatus of claim 6, wherein the switch connects the second conductor to the cathode until the electrical charge is substantially depleted from the pulse-forming line.

8. The apparatus of claim 7, wherein the first and second conductors are of a predetermined length and the duration of the electron current pulse is determined by the length of the conductors.

9. The apparatus of claim 8, wherein the duration of the electron current pulse is independent of the quantity of charge stored in the pulse-forming line.

10. The apparatus of claim 1, wherein the first and second conductors comprise a pulse-forming line for storing an electrical charge responsible for establishing the voltage difference between the cathode and anode grid and wherein the switch connects the second conductor to the cathode until the charge is substantially depleted from the pulse-forming line.

11. An apparatus for generating a plurality of electrons in the form of an electron current pulse, comprising:

(a) an anode grid;

(b) a cold emission cathode, positioned in close proximity to the anode grid, the cathode including means for emitting electrons in response to a voltage difference between the cathode and the anode grid;

(c) first and second conductors that define a pulse-forming line across which a voltage difference may be established, the first conductor being coupled to the anode grid;

(d) a switch, coupled between the cathode and the second conductor, for selectively connecting the second conductor to the cathode and allowing a voltage difference to be applied between the cathode and anode grid such that electrons are emitted from the cathode as an electron current pulse; and (e) means for providing an electrical charge on the pulse-forming line that includes:

(i) a voltage supply having first and second terminals, the first terminal being connected to the first conductor of the pulse-forming line; and (ii) a charging switch, coupled between the second terminal of the voltage supply and the second conductor of the pulse-forming line, wherein the charging switch is selectively operable to connect the voltage supply to the pulse-forming line.

12. The apparatus of claim 11, wherein the switch is a subnanosecond, light-activated switch.

13. The apparatus of claim 12, wherein the cold emission cathode and light-activated switch are placed in close proximity.

14. The apparatus of claim 10, wherein the cold emission cathode and light-activated switch form a single semiconducting device.

15. The apparatus of claim 11, wherein the switch is operable to selectively connect the second conductor to the cathode at times controllable to within less than 100 picoseconds.

16. A method of converting an electrical charge stored in a capacitive device into a plurality of electrons in the form of an electron current pulse, comprising the steps of:

(a) charging the capacitive device to a desired voltage potential;

(b) providing an activation signal to a switch coupled between the capacitive device and a cold field-emitting cathode, the activation signal, in part, determining the timing of the electron current pulse; and (c) closing the switch in response to the activation signal to connect the capacitive device to the cold field-emitting cathode, whereby an electric field is developed between the cathode and an anode grid to emit an electron current pulse from the cathode through the anode grid, wherein the step of closing the switch is performed at a time suitable for causing the energy of the electrons comprising the electron current pulse to be added to an electromagnetic field present between the anode grid and a closure grid.

17. The method of claim 16, wherein the delay between the step of providing the activation signal and the step of closing the switch in response to the activation signal is less than a few tens of picoseconds.

18. The method of claim 16, and further including the step of collecting the electrons comprising the electron pulse using a collector positioned adjacent the closure grid.

* * * * *

UNITED STATES PATENT AND TRADEMARK OFFICE

CERTIFICATE OF CORRECTION

PATENT NO. : 5,534,824

DATED : July 9, 1996

INVENTOR(S) : E.J. Nalos et al.

It is certified that error appears in the above-indentified patent and that said Letters Patent is hereby corrected as shown below:

| COLUMN | LINE | |
|---|---|---|
| 16 (Claim 14, | 8 line 1) | "10," should read --13,-- |

Signed and Sealed this

Tenth Day of December, 199(

Attest:

BRUCE LEHMAN

Attesting Officer

Commissioner of Patents and Trademarks